US010973122B1

(12) United States Patent
Benedict

(10) Patent No.: US 10,973,122 B1
(45) Date of Patent: Apr. 6, 2021

(54) DIFFERENTIAL VIA STACK

(71) Applicant: HEWLETT PACKARD ENTERPRISE DEVELOPMENT LP, Houston, TX (US)

(72) Inventor: Melvin K. Benedict, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/888,392

(22) Filed: May 29, 2020

(51) Int. Cl.
*H05K 1/11* (2006.01)
*H05K 3/46* (2006.01)
*H05K 3/00* (2006.01)
*H05K 1/18* (2006.01)

(52) U.S. Cl.
CPC ............. *H05K 1/115* (2013.01); *H05K 1/181* (2013.01); *H05K 3/0047* (2013.01); *H05K 3/4644* (2013.01)

(58) Field of Classification Search
CPC ...... H05K 1/115; H05K 3/0047; H05K 1/181; H05K 3/4644
USPC ........................................................ 174/262
See application file for complete search history.

(56) References Cited

U.S. PATENT DOCUMENTS

| | | | |
|---|---|---|---|
| 7,078,812 B2 | 7/2006 | Frank et al. | |
| 7,633,766 B2 | 12/2009 | Regnier et al. | |
| 2006/0151869 A1* | 7/2006 | Gisin | H05K 1/0251 257/698 |
| 2008/0250377 A1* | 10/2008 | Bird | H05K 1/113 716/137 |
| 2014/0182891 A1* | 7/2014 | Rengarajan | H05K 1/116 174/251 |
| 2017/0318665 A1* | 11/2017 | Bois | H05K 1/0225 |
| 2019/0116668 A1 | 4/2019 | Lizalde Moreno et al. | |
| 2019/0239338 A1* | 8/2019 | Benedict | H01R 12/716 |
| 2019/0289710 A1* | 9/2019 | Kumar | H05K 1/115 |

OTHER PUBLICATIONS

Chin, T.K.; "Differential Pairs: Four Things You Need to Know About Vias"; https://e2e.ti.com/blogs_/b/analogwire/archive/2015/06/10/differential-pairs-four-things-you-need-to-know-about-vias; Jun. 10, 2015; 3 pages.
Texas Instruments; "High-Speed Layout Guidelines for Signal Conditioners and USB Hubs"; Aug. 2018; 25 pages.

\* cited by examiner

*Primary Examiner* — Sherman Ng
(74) *Attorney, Agent, or Firm* — Sheppard Mullin Richter & Hampton LLP

(57) ABSTRACT

A printed circuit board includes a top conducting layer, an escaping layer, one or more first reference layers interposed between the top conducting layer and the escaping layer, and a second reference layer disposed under the escaping layer. The top conducting layer includes two connecting pads for receiving a pair of differential signals. A pair of vias are provided to extend vertically to penetrate the one or more first reference layers, the escaping layer, and the second reference layer. The vias connects the top conducting layer with the escaping layer. Each of the one or more first reference layers includes a continuous via void surrounding the pair of vias. The second reference layer includes two round via voids each surrounding one of the vias. The second reference layer includes a conductive film disposed between the two round via voids.

12 Claims, 7 Drawing Sheets

US 10,973,122 B1

DIFFERENTIAL VIA STACK

DESCRIPTION OF RELATED ART

Differential signaling employs a pair of complementary signals, which are sent on conducting paths to a destination electronic device. The technique is generally used to avoid electromagnetic interference on the signals as the electromagnetic interference tends to have similar effects on the conducting paths. Since the destination electronic device detects the difference between the pair of differential signals on the conducting paths, the electromagnetic interference could be cancelled as similar electromagnetic noises would be seen on the conducting paths. Differential signaling can generally be found on printed circuit boards (PCBs) and electrical connectors.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

A PCB generally has multiple conduction layers that are designated for connections for various electronic components attached thereon. A PCB also includes multiple vertical connecting paths that can connect the horizontal conduction layers. Those vertical connecting paths are called "vias." As the size of the electronic components, such as integrated circuits, is shrinking, the mounting pads, connecting lines, and vias on a PCB are squeezed to a smaller dimension. This creates challenges to effectively route signals through the PCB. For example, transitioning differential signals between layers at the frequencies of, for example, more than 12 GHz in existing technologies becomes more difficult with each generation of the products that require a higher frequency and a miniature size.

Vias are employed to route differential signals through a PCB. Vias can be formed on a PCB by drilling or etching techniques to generate holes and then refilled the holes with a conductive material. To effectively route differential signals through vias, the present disclosure provides via voids configured to improve coupling of the differential signals as they are transmitted through layers of the PCB. The via voids are regions that surround a pair of differential signal vias and are cutouts of conducting materials that form the conduction layers of the PCB. The via voids are filed with dielectric materials such that the coupling of the differential signals can be maintained as the differential signals are transmitted through the conduction layers.

Figure 1:
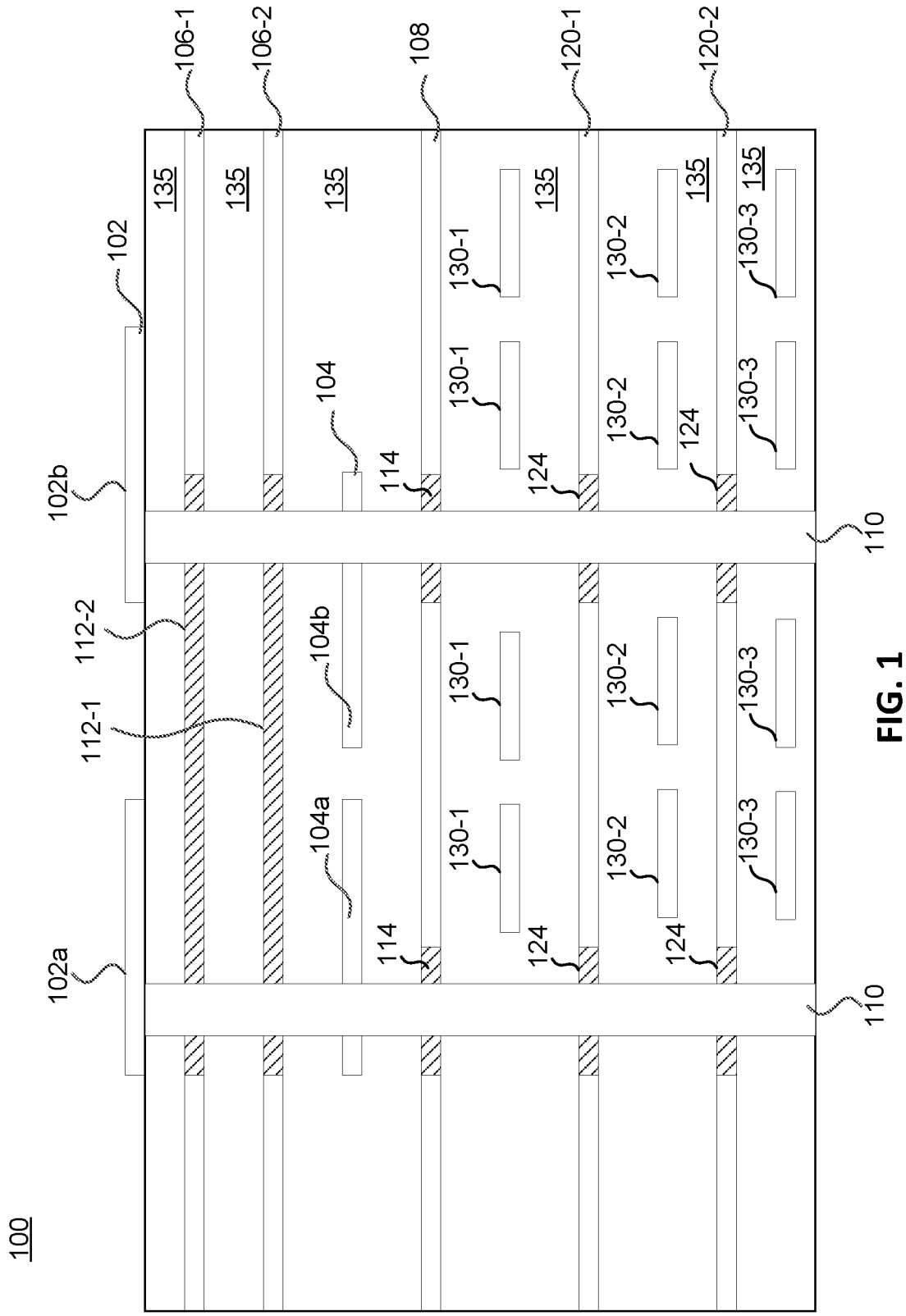
FIG. 1 illustrates a cross sectional view of a PCB provided with via voids, according to one example embodiment of this disclosure.

Reference is now made to FIG. 1. FIG. 1 illustrates a cross sectional view of a PCB 100 that is provided with via voids, according to one example embodiment of this disclosure. The PCB 100 includes a top conducting layer 102 facing outward. The top conducting layer 102 include a plurality of connecting pads for connection with one or more electronic components or connectors. As a non-limiting example, two connecting pads 102a and 102b are shown in FIG. 1. In some embodiments, the connecting pads 102a and 102b may be soldering pads for forming a ball grid array (BGA) for bonding with an integrated circuit (IC). The connecting pads 102a and 102b are configured to receive a pair of differential signals.

The PCB 100 further includes an escaping layer 104 buried under the surface of the PCB 100. The escaping layer 104 includes at least a pair of escaping lines 104a and 104b that allow transmission of the differential signals horizontally at the escaping layer 104. Although one escaping layer 104 is illustrated in FIG. 1, this disclosure is not so limited. In some embodiments, two or more escaping layers may be provided in the PCB 100. One or more first reference layers 106 are interposed between the top conducting layer 102 and the escaping layer 104. As a non-limiting example, two first reference layers 106-1 and 106-2 are illustrated in FIG. 1. A second reference layer 108 is disposed under the escaping layer 104. A pair of vias 110 are provided to extend vertically to penetrate the one or more first reference layers 106, the escaping layer 104, and the second reference layer 108. The vias 110 connect the connecting pads 102a and 102b of the top conducting layer 102 to the escaping lines 104a and 104b of the escaping layer 104 such that the differential signals can be transmitted from the connecting pads 102a and 102b to the escaping lines 104a, and then to other parts of the PCB 100.

Each of the one or more first reference layers 106 includes a continuous via void 112 surrounding the pair of vias 110. The via void 112 is continuous between the pair of vias 110 and filled with a dielectric material. Portions of a first reference layer 106 outside of the via void 112 may be formed with a conductive materials, such as metal or alloy. Because no conductive material is present between the vias 110 at the continuous via void 112, the coupling of the differential signals traveling through the vias 110 may be less impacted, allowing the differential signals to be transmitted deeper into the PCB 100.

The second reference layer 108 includes a pair of round via voids 114. Each of the round via voids 114 is disposed to surround a via 110. The second reference layer 108 further includes a conductive film 116 disposed between the two round via voids 114. In contrast to the continuous via voids 112 where a dielectric material is filled in the portion between the vias 110, the conductive film 116 is disposed between the two round via voids 114 to shield noise coming from under the second reference layer 108. This configuration further enables the transmission of the differential signals in the PCB 100.

In some embodiments, the first reference layers 106 and the second reference layer 108 may provide signal return paths or ground planes for the PCB 100. The functions of the first reference layer 106 and the second reference layer 108 are not limited to these examples, and may include other functions based on design and performance requirements of the PCB 100.

In some embodiments, the PCB 100 may further include one or more third reference layers 120 disposed under the second reference layer 108. FIG. 1 illustrates two such third reference layers 120-1 and 120-2 although this disclosure is not so limited. Each of the third reference layers 120-1 and 120-2 also includes at least a pair of round via voids 124. Each of the round via voids 124 is disposed to surround a via 110. Similar to the second reference layer 108, each of the third reference layers 120 may further include a conductive film 126 disposed between the two round via voids 124. In some embodiments, the conductive films 126 may include one or more routing lines for routing various electrical signals. In some instances, the conductive films 126 may be a ground plane to shield electromagnetic noises.

In some embodiments, the PCB 100 may further include one or more routing layers 130. Three routing layer 130-1, 130-2, and 130-3 are illustrated in FIG. 1. The routing layers 130 are provided to route various electrical signals through the PCB 100. The routing layers 130 are disposed under the second reference layer 108 such that they do not interfere with the differential signals transmitted from the top conducting layer 102, through the vias 110, to the escaping layer 104. Each of the routing layers 130 may be interposed between conductive films 116 and 126 to prevent the electromagnetic interference generated at the routing layers 130 to escape. The routing lines of the routing layers 130 can be used for routing high speed signals. Each of the routing layers 130 may include one or more routing lines. The routing lines of the routing layers 130 may be disposed between the vias 110 and/or at other portions not between the vias 110.

The space between the layers 102, 104, 106, 108, 120, 130 is filled with an insulating material 135 to provide insulation for the different layers.

In some implementations, to provide better differential signals at the PCB, the via studs under the second reference layer 108 may be removed. As the differential signals are routed at the escaping layer 104, the vias 110 under the escaping layer 104 do not provide routing function for the differential signals. If the via studs are not removed, they may cause signal distortion and attenuation for the differential signals. Further, the via studs may become a source of electromagnetic interference that may affect other components of the PCB 100.

Figure 2:
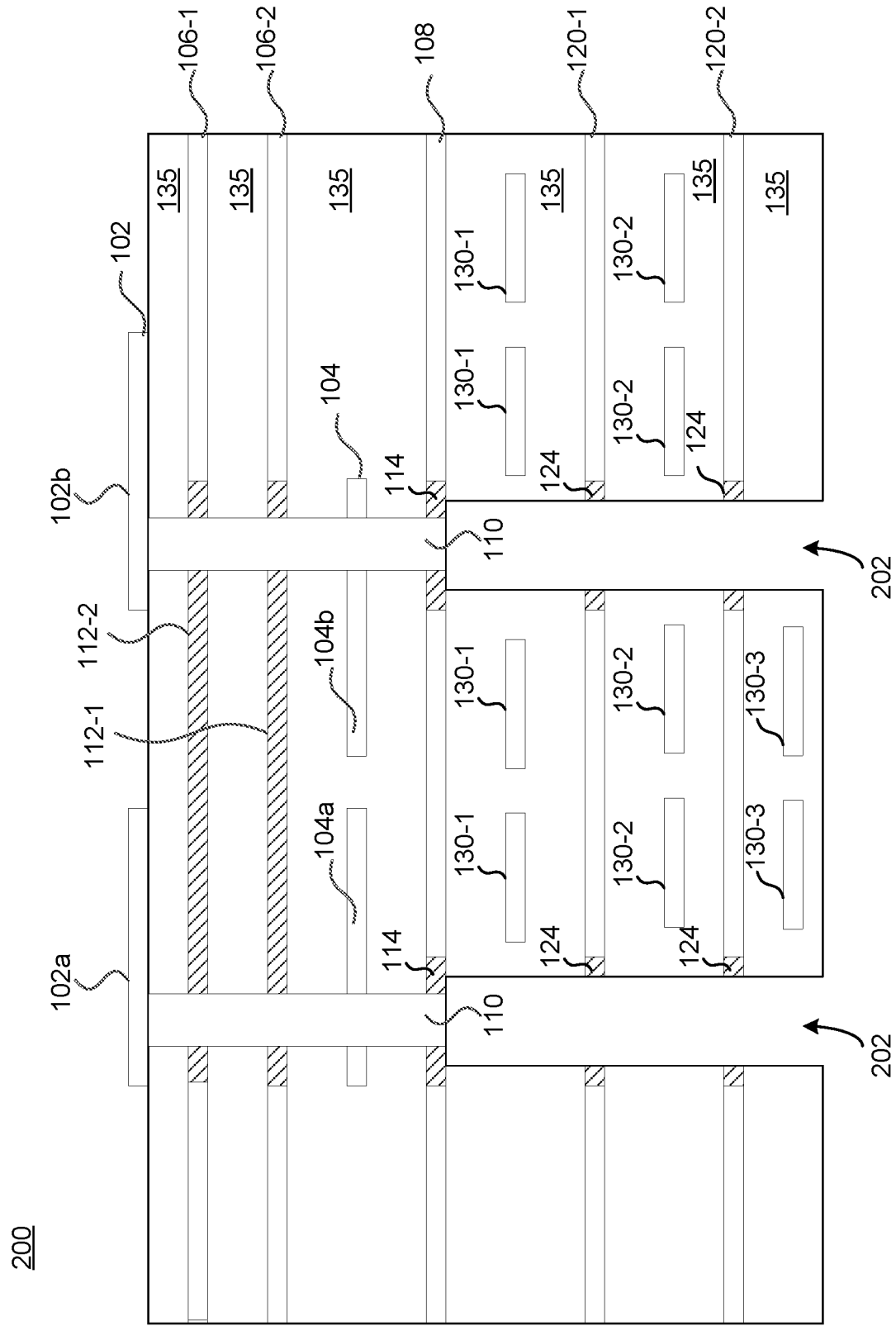
FIG. 2 illustrates a cross sectional view of another PCB provided with via voids, according to one example embodiment of this disclosure.

As a non-limiting example, a back drilling technique may be employed to remove the via studs (conductive material) under the second reference layer. Reference is now made to FIG. 2. FIG. 2 illustrates a cross sectional view of a PCB 200 according to one example embodiment of this disclosure. The PCB 200 is similar to PCB 100 except that the PCB 200 includes back-drilled holes 202. The back-drilled holes 202 penetrate the round via voids 124 of the third reference layers 120 and stop at or about the round via voids 114 of the second reference layer 108. This structure preserves the integrity of the second reference layer 108 that allows the differential signals to travel at the escaping layer 104 immediately above the second reference layer 108. A diameter of the back-drilled holes 202 is less than a diameter of the round via voids 114 of the second reference layer 108 and/or a diameter of the via voids 124 of the third reference layers 120 such that the conductive portions of the second reference layer 108 and/or the third reference layers 120 may not be damaged by the back drilling technique. As a non-limiting example, the back-drilled holes 202 may be filed with an insulting material to prevent contamination from entering into the back-drilled holes 202.

Figure 3:
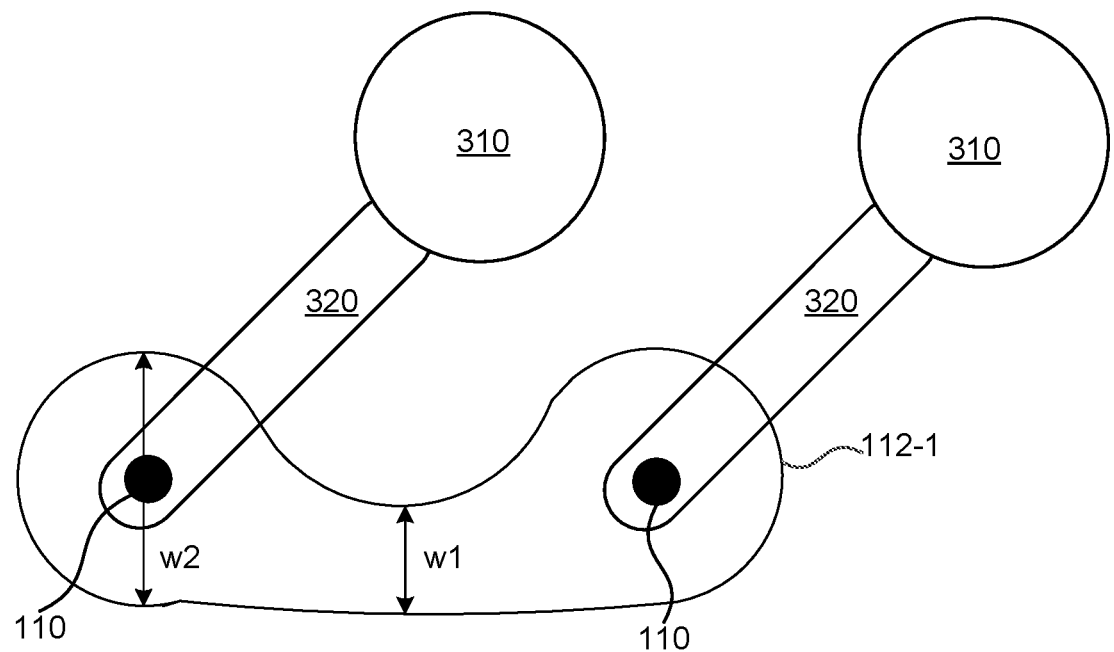
FIG. 3 is a perspective view from the top of the PCB of FIG. 1 illustrating a top conducting layer and a first reference layer, according to one example embodiment.

FIG. 3 is a perspective view from the top of the PCB 100 of FIG. 1, according to one example embodiment. The first two layers of the PCB 100, i.e., the top conducting layer 102 and the first reference layer 106-1, are illustrated in FIG. 3. Each of the connecting pads 102a and 102b of the top conducting layer 102 are provided in a spoon shape having a head portion 310 and an elongated handle portion 320. The head portions 310 can be a soldering land for a BGA connection with an electronic component. Differential signals can be routed through the head portions 310 and the elongated handle portions 320 to the vias 110, or vice versa. It should be understood that the shape of the connecting pads 102a and 102b is not limited to this example, other suitable shapes of the connecting pads 102a and 102b are contemplated.

The continuous via void 112-1 of the first reference layer 106-1 as shown in FIG. 3 is of a "dog bone" shape. A width w1 of the continuous via void 112-1 between the vias 110 is less than a width w2 of the continuous via void 112-1 at the vias 110. This configuration can minimize the area occupied by the continuous via void 112-1 and allow more areas in the reference layer 106-1 to be used for other purposes, e.g., grounding or routing. Other shapes, such as an oval or rectangle, may be adopted as long as the via void 112-1 is continuous between the vias 110 to allow coupling of the differential signals.

Figure 4:
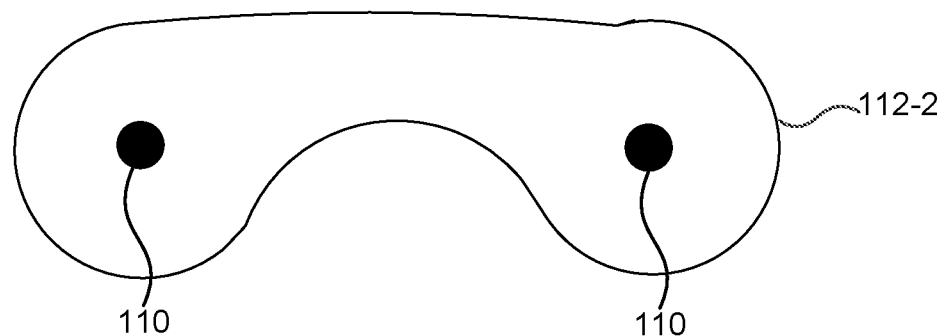
FIG. 4 is a top view of a via void of the first reference layer illustrated in FIG. 1, according to one example embodiment.

FIG. 4 is a top view of another via void 112-2 of the first reference layer 106-2 illustrated in FIG. 1, according to one example embodiment. The via void 112-2 is also of a "dog bone" shape similar to that of via void 112-1 of FIG. 3, but is a mirror image of the via void 112-1 along a horizontal line. As explained above, the via void 112-2 can be of other shapes and is not limited to the example illustrated in FIG. 4.

Figure 5:
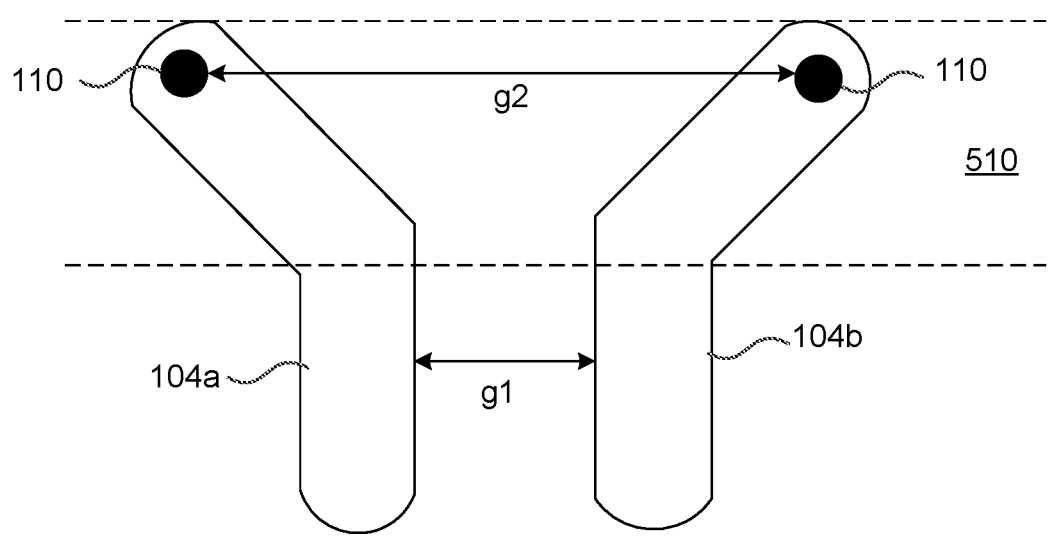
FIG. 5 is a top view of the escaping layer of FIG. 1 according to one example embodiment.

FIG. 5 is a top view of the escaping layer 104 of FIG. 1 according to one example embodiment. The escaping lines 104a and 104b are bent to each other after leaving the vias 110. After extending outside of the transition area 510, the escaping lines 104a and 104b are disposed to parallel to each other. A gap g1 between the escaping lines 104a and 104b is less than a gap between the vias 110. This structure allows the differential signals travelling on the escaping lines 104a and 104b to maintain better coupling, which in turn improve the integrity of the differential signals.

Figure 6:
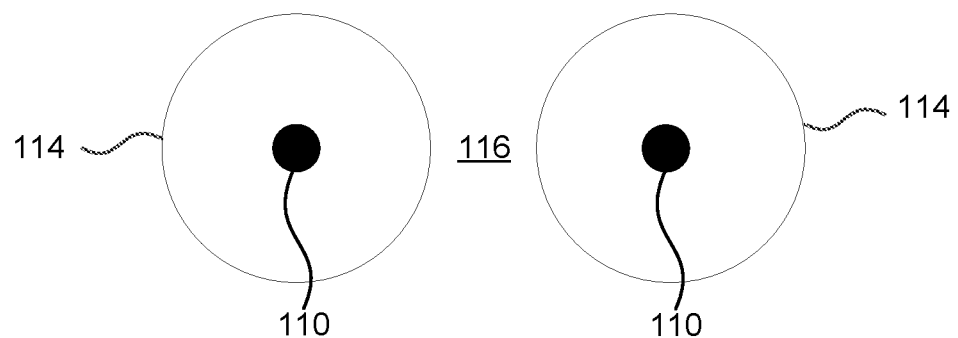
FIG. 6 is a top view of the second reference layer of FIG. 1 according to one example embodiment.

FIG. 6 is a top view of the second reference layer 108 of FIG. 1, according to one example embodiment. The via voids 114 of the second reference layer 108 are generally of a round shape, and are separated by the conductive film 116. The via voids 114 are provided to shield the vias 110 from the conductive film 116. Although via voids 112 of the first reference layers 106 are continuous between the vias 110, the via voids 114 of the second reference layer 108 is purposefully separated to allow the conductive film 116 to be placed therein. This is because the via voids 112 are provided in the transmission path of the differential signals and are configured to allow coupling of the differential signals. It is desired that no conductive material is disposed between the vias 110 in the via voids 112 as a conductive material tends to impede the coupling of the differential signals. After the differential signals are routed at the escaping layer 104, the second reference layer 108 may be provided to shield electromagnetic interference emanated from the routing layers 130 under the escaping layer 104. To better protect the signal integrity of the differential signals, the second reference layer 108 is provided with a conductive film 116 disposed under the escaping lines 104a and 104b. This conductive film 116 can reduce the electromagnetic field from interfering the differential signals at the escaping lines 104a and 104b.

Figure 7:
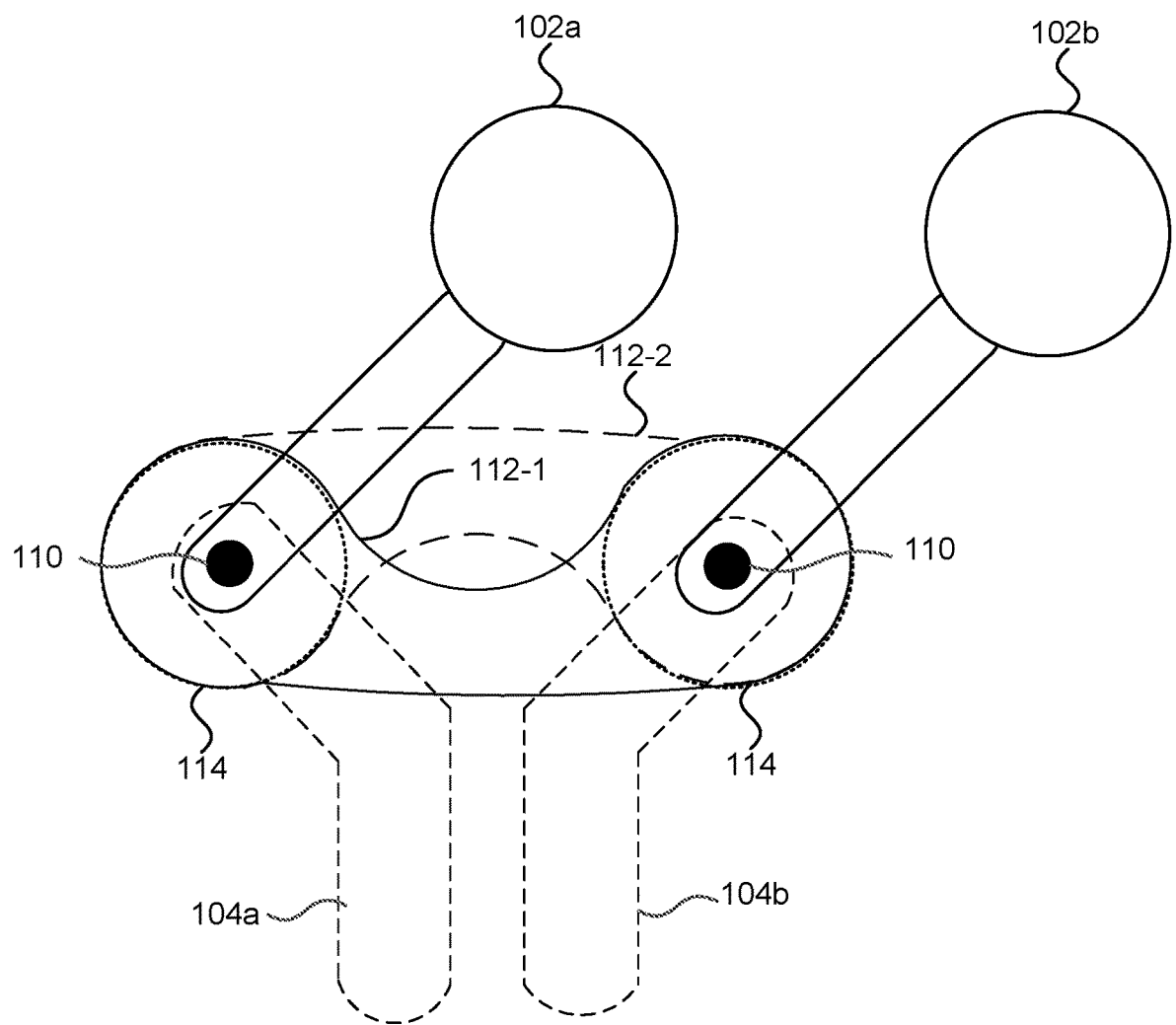
FIG. 7 is a perspective top view of the PCB of FIG. 1 illustrating the top conducting layer, the escaping layer, the first reference layers, and the second reference layer, according to one example embodiment.

FIG. 7 is a perspective top view of the PCB 100 of FIG. 1 illustrating the top conducting layer 102, the escaping layer 104, the first reference layers 106, and the second reference layer 108, according to one example embodiment. As shown in FIG. 7, at least a portion of an outer periphery of the continuous via voids 112 of the first reference layers 106 is substantially aligned with a portion of an outer periphery of the round via voids 114 of the second reference layer 108. This configuration allows the differential signals to travel through the vias 110 with consistent signal integrity.

Figure 8:
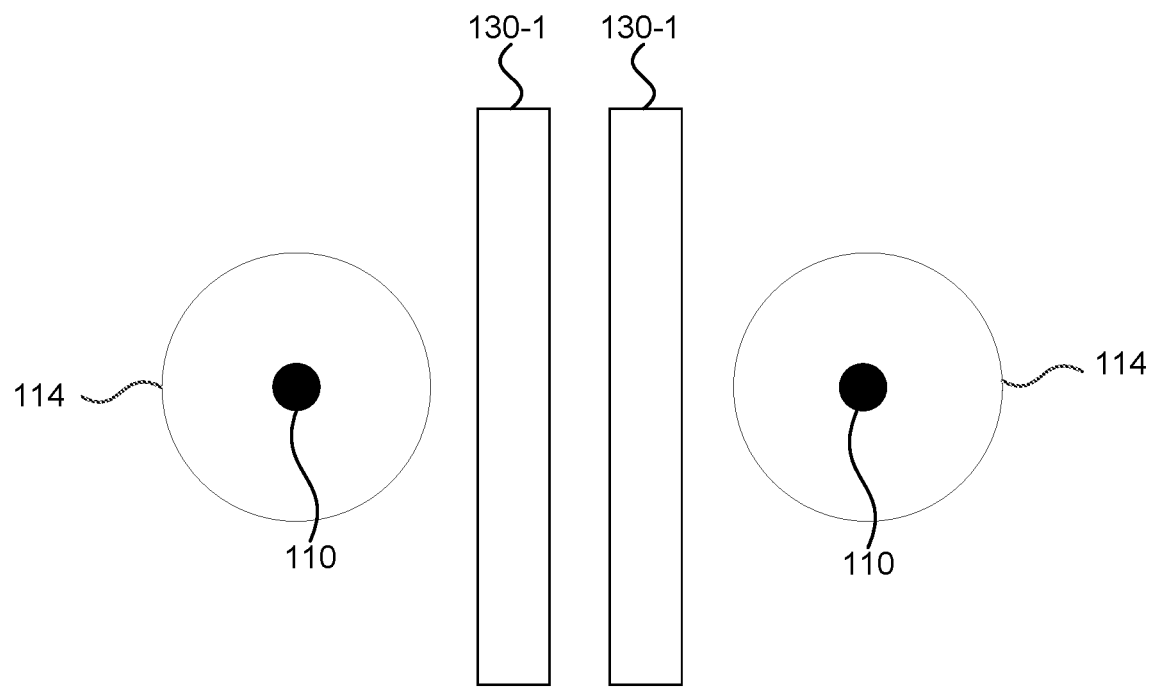
FIG. 8 is a perspective top view showing the second reference layer and the routing lines of FIG. 1, according to one example embodiment.

FIG. 8 is a perspective top view showing the second reference layer 108 and the routing lines 130-1 of FIG. 1, according to one example embodiment. The routing lines 103-1 are disposed at an area corresponding to a location between two vias 110 or two via voids 114 of the second reference layer 108. With reference to FIGS. 1 and 2, the routing lines 130-1 are disposed at the lower portion of the PCB 100 or 200 corresponding to layers that are under the second reference layer 108. The upper portion of the PCB 100 or 200 between the vias 110 is reserved for transmission of the differential signals. For example, the first reference layer 106 are provided with continuous via voids 112-1 and 112-2 to improve coupling of the differential signals. No routing lines are disposed between the vias 110 at the first reference layers 106.

In summary, the example PCB structures illustrated in FIGS. 1-8 provide multiple advantages over the conventional PCB structures. First, the disclosed PCB provides a signal plane, e.g., the top conducting layer 102, for routing differential signals. Second, the disclosed PCB provides one or more reference planes, e.g., the first reference layers 106, that include continuous via voids surrounding the vias to improve coupling of the differential signals at the vias. The first reference layers 106 can also provide differential signal routing outside of the via voids. Third, the disclosed PCB provides a differential signal escaping plane, e.g., the escaping layer 104, to allow the differential signals to escape. Fourth, the disclosed PCB provides a reference plane under the escaping plane, e.g., the second reference layer 108. This reference plane under the escaping plane can shield the escaping plane from electromagnetic interference emanated from the routing planes under the escaping plane. Fifth, the disclosed PCB provides one or more routing planes, e.g., the routing layers 130, for routing signals including differential signals in the PCB. In some embodiments, back-drilled holes are provided in the PCB (FIG. 2). The back-drilled holes remove via studs under the second reference layer to reduce signal distortion and attenuation at the vias. Further, the disclosed PCB reduces crosstalk between the differential signals transmitted above the second reference layer 108 and signals routed under the second reference layer 108.

The advantages provided by the disclosed PCB result in reduced PCB cost because fewer layers are needed to provide robust differential signal transmission.

Figure 9:
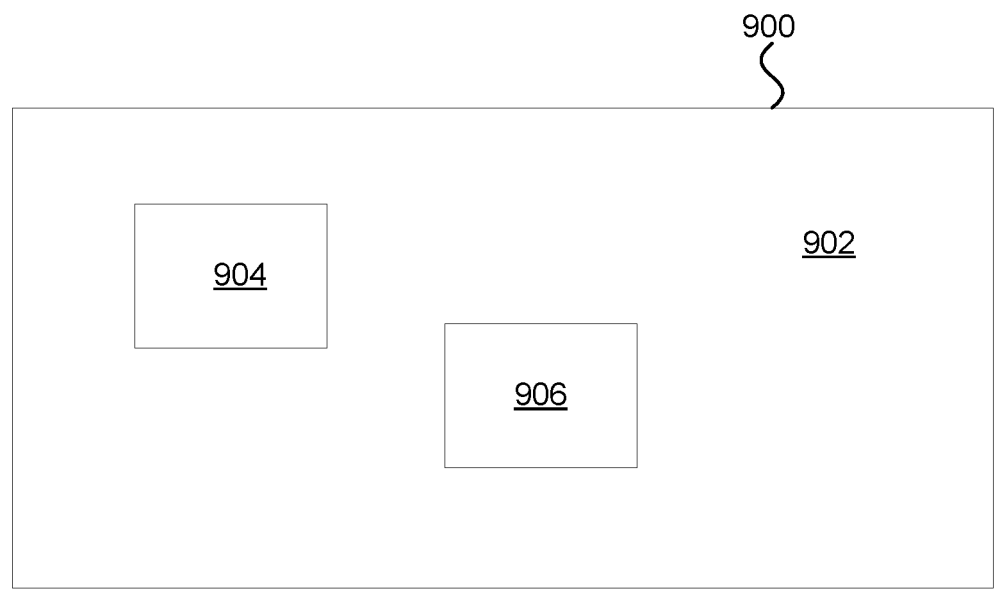
FIG. 9 is a diagram illustrating an electronic device that employs a PCB consistent with embodiments of this disclosure, according to one example embodiment.

FIG. 9 is a diagram illustrating an electronic device 900 that employs a PCB 902 consistent with embodiments of this disclosure, according to one example embodiment. As a non-limiting example, the PCB 902 may be one of the PCBs 100 (FIG. 1) and 200 (FIG. 2). In addition to the PCB 902, the electronic device 900 further includes one or more electrical components 904 and 906 disposed on the PCB 902. The electrical components 904 and 906 may be active components, such as ICs, or passive components, such as resistors, capacitors, and/or inductors.

Figure 10:
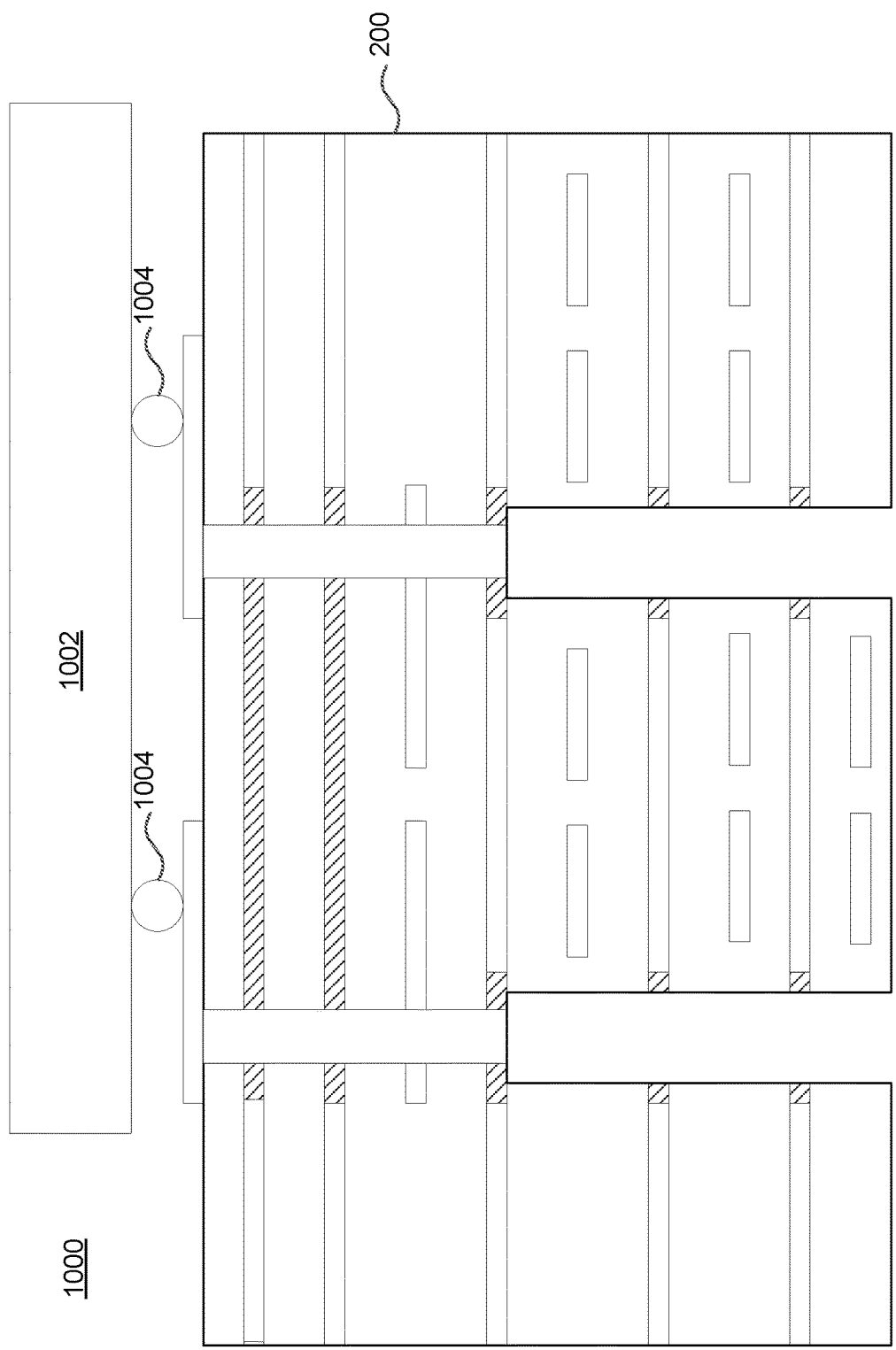
FIG. 10 illustrates a cross sectional view of an electronic device, according to one example embodiment.

FIG. 10 illustrates a cross sectional view of an electronic device 1000, according to one example embodiment. The electronic device 1000 includes the PCB 200 of FIG. 2 and at least one electrical component 1002. The electrical component 1002 is connected to the PCB 200 through solder balls 1004.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A printed circuit board comprising:
a top conducting layer including two connecting pads for receiving a pair of differential signals;
an escaping layer including escaping lines for transmitting the differential signals at the escaping layer;
one or more first reference layers interposed between the top conducting layer and the escaping layer;
a second reference layer disposed under the escaping layer;
a pair of vias extending vertically to penetrate the top conducting layer, the one or more first reference layers, the escaping layer, and the second reference layer;
a third reference layer disposed under the second reference layer; and
back-drilled holes, wherein:
the vias connects the top conducting layer with the escaping layer;
each of the one or more first reference layers includes a continuous via void surrounding the pair of vias, wherein the continuous via void is filled with a first dielectric material;
the second reference layer includes two round via voids each surrounding one of the vias;
a portion of an outer periphery of the continuous via void is aligned with a portion of an outer periphery of the round via voids of the second reference layer;
the third reference layer includes two round via voids each surrounding one of the vias;
the round via voids of the second reference layer and the third reference layer are filled with a second dielectric material;
the back-drilled holes penetrate the two round via voids of the third reference layer and stop at or about the two round via voids of the second reference layer without penetrating the two round via voids of the second reference layer; and
the second reference layer includes a conductive film disposed between the two round via voids of the second reference layer.

2. The printed circuit board of claim 1, wherein:
no routing lines are disposed at the continuous via void of each of the one or more first reference layers.

3. The printed circuit board of claim 1, wherein:
a diameter of the back-drilled holes is less than a diameter of the two round via voids of the second reference layer.

4. The printed circuit board of claim 3, further comprising:
a routing layer interposed between the second reference layer and the third reference layer, wherein the routing layer includes one or more routing lines disposed between the back-drilled holes.

5. The printed circuit board of claim 1, wherein the escaping layer includes two escaping lines each connected to one of the vias, wherein a gap between the two escaping lines is less than a gap between the vias.

6. The printed circuit board of claim 1, wherein the continuous via void has a shape such that a width of the continuous via void between the vias is less than a width of the continuous via void at the vias.

7. An electronic device, comprising:
a printed circuit board; and
one or more electronic components disposed on the printed circuit board,
wherein the printed circuit board comprises:
a top conducting layer including two connecting pads for receiving a pair of differential signals;
an escaping layer including escaping lines for transmitting the differential signals at the escaping layer;
one or more first reference layers interposed between the top conducting layer and the escaping layer;
a second reference layer disposed under the escaping layer;
a pair of vias extending vertically to penetrate the top conducting layer, the one or more first reference layers, the escaping layer, and the second reference layer;
a third reference layer disposed under the second reference layer; and
back-drilled holes, wherein:
the vias connects the top conducting layer with the escaping layer;
each of the one or more first reference layers includes a continuous via void surrounding the pair of vias, wherein the continuous via void is filled with a first dielectric material;
the second reference layer includes two round via voids each surrounding one of the vias;
a portion of an outer periphery of the continuous via void is aligned with a portion of an outer periphery of the round via voids of the second reference layer;
the third reference layer includes two round via voids each surrounding one of the vias;
the round via voids of the second reference layer and the third reference layer are filled with a second dielectric material;
the back-drilled holes penetrate the two round via voids of the third reference layer and stop at or about the two round via voids of the second reference layer without penetrating the two round via voids of the second reference layer; and
the second reference layer includes a conductive film disposed between the two round via voids of the second reference layer.

8. The electronic device of claim 7, wherein:
no routing lines are disposed at the continuous via void of each of the one or more first reference layers.

9. The electronic device of claim 7, wherein:
a diameter of the back-drilled holes is less than a diameter of the two round via voids of the second reference layer.

10. The electronic device of claim 9, further comprising:
a routing layer interposed between the second reference layer and the third reference layer, wherein the routing layer includes one or more routing lines disposed between the back-drilled holes.

11. The electronic device of claim 7, wherein the escaping layer includes two escaping lines each connected to one of the vias, wherein a gap between the two escaping lines is less than a gap between the vias.

12. The electronic device of claim 7, wherein the continuous via void has a shape such that a width of the continuous via void between the vias is less than a width of the continuous via void at the vias.

* * * * *